United States Patent
LeBoeuf et al.

(10) Patent No.: US 6,921,929 B2
(45) Date of Patent: Jul. 26, 2005

(54) LIGHT-EMITTING DIODE (LED) WITH AMORPHOUS FLUOROPOLYMER ENCAPSULANT AND LENS

(75) Inventors: Steven Francis LeBoeuf, Schenectady, NY (US); Donald Joseph Buckley, Jr., Schenectady, NY (US); Stanton Earl Weaver, Northville, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 124 days.

(21) Appl. No.: 10/609,040

(22) Filed: Jun. 27, 2003

(65) Prior Publication Data

US 2005/0006651 A1 Jan. 13, 2005

(51) Int. Cl.$^7$ ............................ H01J 29/24; H01J 1/62; H01L 29/24
(52) U.S. Cl. ................ 257/100; 257/98; 313/512; 313/501; 313/502; 313/503
(58) Field of Search .................. 257/100, 98; 313/512, 313/501, 502, 503

(56) References Cited

U.S. PATENT DOCUMENTS

| | | | |
|---|---|---|---|
| 5,686,360 A | * | 11/1997 | Harvey et al. ............ 438/28 |
| 6,188,527 B1 | | 2/2001 | Bohn |
| 6,407,411 B1 | | 6/2002 | Wojnarowski et al. |
| 2004/0227465 A1 | * | 11/2004 | Menkara et al. ............ 313/585 |

OTHER PUBLICATIONS

"Unique Properties of Teflon® AF", 3 pages, www.dupont.com/teflon/af/unique.html, printed on Apr. 8, 2003.

"High–Performance/Potential Applications", 3 pages, www.dupont.com/teflon/af/potapps.html printed on Apr. 8, 2003.

* cited by examiner

Primary Examiner—David Nelms
Assistant Examiner—Long Tran
(74) Attorney, Agent, or Firm—Scully Scott Murphy & Presser

(57) ABSTRACT

A lens and encapsulant made of an amorphous fluoropolymer for a light-emitting diode (LED) or diode laser, such as an ultraviolet (UV) LED (UVLED). A semiconductor diode die (114) is formed by growing a diode (110) on a substrate layer (115) such as sapphire. The diode die (114) is flipped so that it emits light (160, 365) through the face (150) of the layer (115). An amorphous fluoropolymer encapsulant encapsulates the emitting face of the diode die (114), and may be shaped as a lens to form an integral encapsulant/lens. Or, a lens (230, 340) of amorphous fluoropolymer may be joined to the encapsulant (220). Additional joined or separate lenses (350) may also be used. The encapsulant/lens is transmissive to UV light as well as infrared light. Encapsulating methods are also provided.

15 Claims, 2 Drawing Sheets

LIGHT-EMITTING DIODE (LED) WITH AMORPHOUS FLUOROPOLYMER ENCAPSULANT AND LENS

BACKGROUND OF THE INVENTION

1. Field of Invention

The invention relates generally to a lens and encapsulant for a light-emitting diode (LED) and, more specifically, to an ultraviolet (UV) LED (UVLED).

2. Description of Related Art

Recently, LEDs emitting in the blue and UV range of the electromagnetic spectrum have been demonstrated. Light-emitting diodes (LEDs) are semiconductor devices that are used in many applications, including indicator lamps, displays such as motion picture displays, signage, solid-state lighting, medical, sensing, optical interconnects, and communications including free space and guided wave communications. Ever-improving LED materials and designs provide high brightness, high efficiency, and high-speed capability.

However, current LED encapsulation/lens technologies, such as epoxies or silicones, are suitable for blue and longer optical wavelengths, but not for UV light. UV light is absorbed by most polymeric encapsulants, causing degradation of the encapsulant and reduced light emission. Reduced light extraction, in turn leads to more UV absorption leading to inevitable catastrophic failure. It is problematic that there have been no intermediate-wavelength UV packaging technologies suitable for LEDs.

BRIEF SUMMARY OF THE INVENTION

To overcome these and other deficiencies in the prior art, the present invention describes a light-emitting device that combines a semiconductor diode, such as an LED or a semiconductor diode laser, with an amorphous fluoropolymer encapsulant that may also act as a lens. A one-piece, integral encapsulant/lens, or a joined encapsulant and lens combination, may be used.

In a particular embodiment, a light-emitting device includes a semiconductor diode die that emits light through at least one face thereof, and an encapsulant that at least partially encapsulates the semiconductor diode die, where the encapsulant includes at least a portion adjacent the face that comprises an amorphous fluoropolymer. Preferably, the portion adjacent the face substantially consists of amorphous fluoropolymer.

In a further embodiment, a light-emitting device includes a semiconductor diode die that emits light through at least one face thereof, and an integral encapsulant and lens comprising an amorphous fluoropolymer that encapsulates at least the face of the semiconductor diode die and directs the light emitted through the face.

In yet another embodiment, a light-emitting device includes a semiconductor diode die that emits light through at least one face thereof, an encapsulant comprising an amorphous fluoropolymer that encapsulates at least the face of the semiconductor diode die, and at least one lens comprising an amorphous fluoropolymer joined to the encapsulant for directing the light emitted through the face.

In a further embodiment, a method for encapsulating a light-emitting device includes providing a semiconductor diode device that emits light through at least one face thereof, and at least partially encapsulating the semiconductor diode device using an encapsulant including at least a portion adjacent the face that comprises an amorphous fluoropolymer.

In another embodiment, a method for coating a light-emitting device includes providing at least one semiconductor diode device that emits light through at least one face thereof, and at least partially coating the at least one semiconductor diode device including at least a portion adjacent the face using a coating that comprises an amorphous fluoropolymer.

BRIEF DESCRIPTION OF THE DRAWINGS

These and other features, benefits and advantages of the present invention will become apparent by reference to the following text and figures, with like reference numbers referring to like structures across the views, wherein.

DETAILED DESCRIPTION OF THE INVENTION

Figure 1:
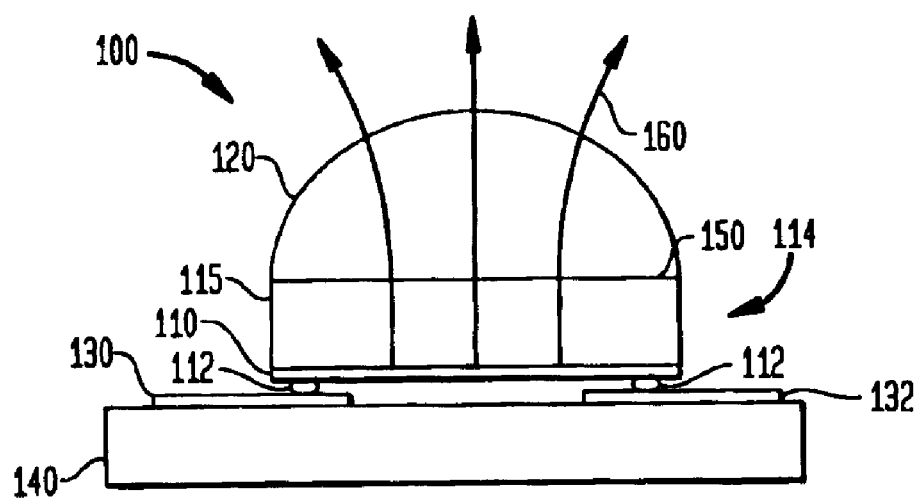
FIG. 1 illustrates a schematic view of an encapsulated LED with an integral encapsulant/lens mounted to a circuit board according to the invention.

FIG. 1 illustrates a schematic view of an encapsulated LED with an integral encapsulant/lens mounted to a circuit board according to the invention. The encapsulated LED 100 includes a semiconductor diode die 114, which may be a UVLED die, and a shaped integral lens/encapsulant 120. The die 114 may include a diode 110 that is grown on a substrate layer 115 as a flip chip, discussed further below. To improve UV light extraction from the die 114, a form of amorphous polytetrafluoroethylene (PTFE) fluoropolymer is advantageously used as an encapsulant and/or lens. Examples of amorphous fluoropolymers that are commercially available include Teflon® AF from Dupont® and Cytop(tm) from Asahi Glass Co., Ltd., Tokyo, Japan. Such materials are able to transmit UV light, while also passing infrared (IR) light, and are compatible with current LED encapsulation/lens packaging techniques. For example, these materials can be readily injection molded to any desired shape, such as into an encapsulant and lens, in much the same way as for silicon, the current workhorse of LED encapsulation. For example, the encapsulant may be shaped as a lens by applying solvent and shaping it while it sets. Alternatively, the materials can be applied as a thin coating in a fluorosolvent.

Amorphous fluoropolymers such as Teflon AF® pass 80 to 95% of UV light without degradation in the UV range of 200–400 nm, while a typical range of interest for a UVLED is the intermediate UV range of approximately 250–380 nm. Energy below 200 nm tends to be ionizing. In addition, amorphous fluoropolymers possess excellent mechanical, thermal, and dielectric properties that are highly suitable for LED encapsulation. Also importantly, amorphous fluoropolymers pass IR wavelengths whereas many polymers do not. This allows the introduction of IR light for IR-photoionization in an IR-pumping scheme as well as the escape of unwanted thermally generated IR light. In an LED using an amorphous fluoropolymer encapsulant, IR light can easily transmit through the lens to either relieve radiative heat and/or to pass IR light to the LED for enhanced performance.

In FIG. 1, the diode die 114 is attached to voltage contacts 130 and 132 on a printed circuit board (PCB) 140 using a micro-ball grid array ($\mu$BGA). In particular, the diode 110 may be grown on the substrate layer 115 using a flip chip, or Direct Chip Attach (DCA), type of microelectronic assembly. The substrate layer 115 may comprise, e.g., sapphire, Gallium Nitride (GaN), Zinc Oxide (ZnO), Aluminum Gallium Nitride (AlGaN), Aluminum Nitride (AlN) or Lithium Gallate (LiGaO$_2$). These materials pass UV light. Sapphire, AlGaN, and AlN also pass IR light. It is also advantageous for the layer 115 to be selected from materials having a similar refractive index (n) as the lens/encapsulant 120. Flip chip assembly involves the direct electrical connection of face-down (hence, "flipped") electronic components onto substrates, circuit boards, or carriers, by means of conductive bumps 112 on the chip bond pads. The bumps provide the conductive path from chip to substrate, as well as a thermally conductive path to carry heat from the chip to the substrate. The bumps further provide part of the mechanical mounting of the die to the substrate, and also provide a spacer, preventing electrical contact between the chip and substrate conductors. The bumps further act as a short lead to relieve mechanical strain between board and substrate.

In a particular embodiment, solder bumping is used. This involves placing an under bump metallization (UBM) on the chip bond pads, e.g., by sputtering, evaporating, or plating, to replace the insulating aluminum oxide layer and to define and limit the solder-wetted area. Solder is deposited over the UBM by evaporation, electroplating, screen printing, solder paste, or needle-depositing. After solder bumping, the wafer is sawn into bumped die. The plural bumped die are placed on the substrate pads, and the assembly is heated to make a solder connection. Other flip chip designs may also be used. Furthermore, as an alternative to a flip chip, an epitaxial layer up (epi-up) device with substrates including SiC, InGaN, InN, Silicon, GaAs, or others may be used. An inverted device where the p-portion rather than the n-portion touches the substrate may also be used.

Thus, after the diode 110 is grown on the substrate layer 115, the resulting die or chip 114 is inverted and attached to the PCB 140, and the lens/encapsulant 120 is formed, including at least a portion that is adjacent to the face 115. When energized, the diode 110 emits light 160 through its top face into the layer 115. The light passes through the layer 115 and the top face 150 of the layer 115, and through the lens/encapsulant 120. The diode 110 may also emit light through its sides. This light can be gathered and directed as well, e.g., as discussed in connection with FIG. 3. The lens/encapsulant 120 may cover the sides of the diode die 114 as well as the top face 150. Furthermore, it is possible for an amorphous fluoropolymer encapsulant to be used adjacent the face 150, where light is emitted, while a different encapsulant is used elsewhere for the die 114. Additional packaging that is transparent to the light wavelengths of interest may be used as well. Generally, the lens/encapsulant 120 may be shaped as desired to direct the emitted light. For example, a converging, diverging or collimating lens can be provided. An example of a converging lens is a Kepler beam expanded, while an example of a diverging lens in a Galilean beam expander.

Figure 2:
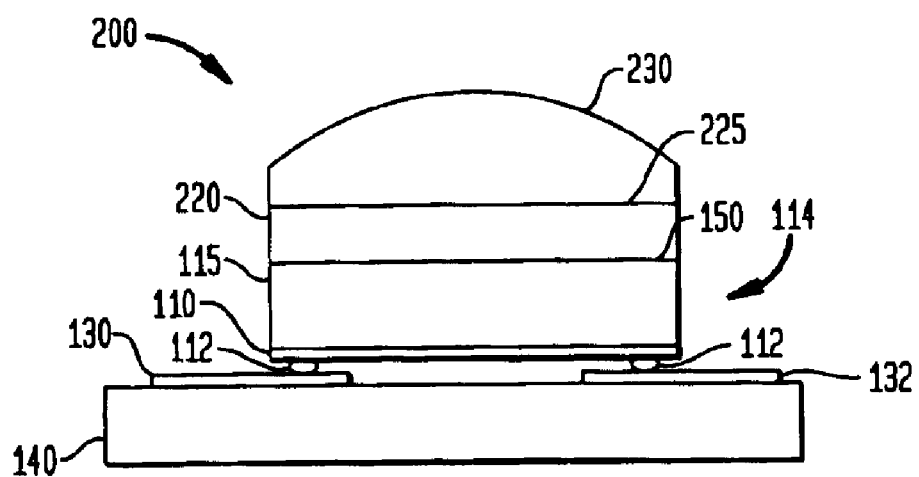
FIG. 2 illustrates a schematic view of an encapsulated LED with a lens joined to an encapsulant according to the invention.

FIG. 2 illustrates a schematic view of an encapsulated LED 200 with a lens 230 joined to an encapsulant 220 according to the invention. The lens 230, also substantially consisting of amorphous fluoropolymer, may be attached to the encapsulant 220 at an interface 225 by epoxy, bonding, pressure molding or other approach. In another option, a first lens is joined to the encapsulant 220, and a second lens is joined to the first lens. In another option, the lens 230 may be spaced apart from the encapsulant 220. In yet another option, a second lens may be used which is joined to, or spaced apart from an integral, e.g., one-piece, encapsulant/lens, such as encapsulant/lens 120 (FIG. 1) or a joined encapsulant and lens combination, such as encapsulant 220 and lens 230 (FIG. 2). A combination of the above approaches may be used as well, for example, an integral encapsulant/lens with one or more further lenses joined. Furthermore, note that any integral lens/encapsulant or lens and encapsulant combination may be provided on top of the die 114, and/or around the exposed sides.

Figure 3:
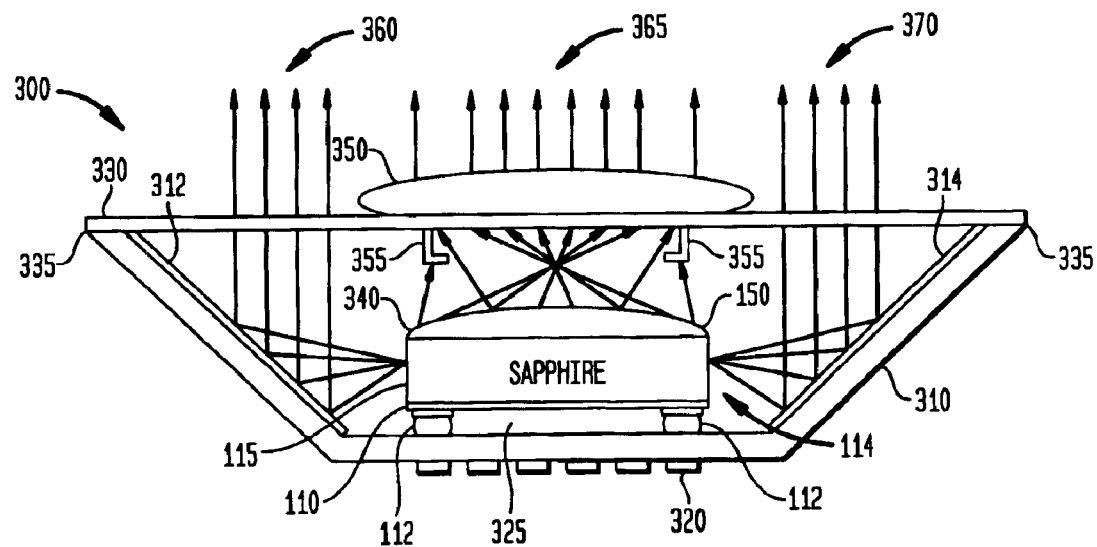
FIG. 3 illustrates a sectional view of packaging for an encapsulated LED with an integral encapsulant and first lens, and a second, detached lens, according to the invention.

FIG. 3 illustrates a sectional view of packaging 300 for an encapsulated LED with an integral encapsulant and first lens, and a second, detached lens, according to the invention. In this example, the diode die 114 is a solder bumped flip chip LED mounted in a lead frame 310. Enhanced thermal interfaces 325 may be achieved by diamond under filled epoxies, or multiple addition of redundant $\mu$BGAs. A thermal under filling 320 may also be provided. A quartz plate and seal 330 is attached to the lead frame 310 via epoxy seals 335 and 336. On the sapphire or other transmissive layer 115 sits an integral encapsulant and lens 340, which in this case includes a converging lens that receives the emitted light from the layer 115. The light is intentionally directed out the layer 115. The emitted light is converged toward a second lens 350, which is a collimating lens for producing collimated light 365. The integral encapsulant and lens 340 and second lens 350 are preferably made substantially of an amorphous fluoropolymer. Stray light orifice structures 355 prevent stray light from reaching the second lens 350. Aluminum coatings 312 and 314 with dielectric optical coatings reflect light that is emitted from the sides of the diode 110 upwards to provide collimated light 360 and 370, respectively. The packaging 300 thus efficiently directs the light output from the diode die 110 in a uniform direction for maximum light output and brightness.

Figure 4:
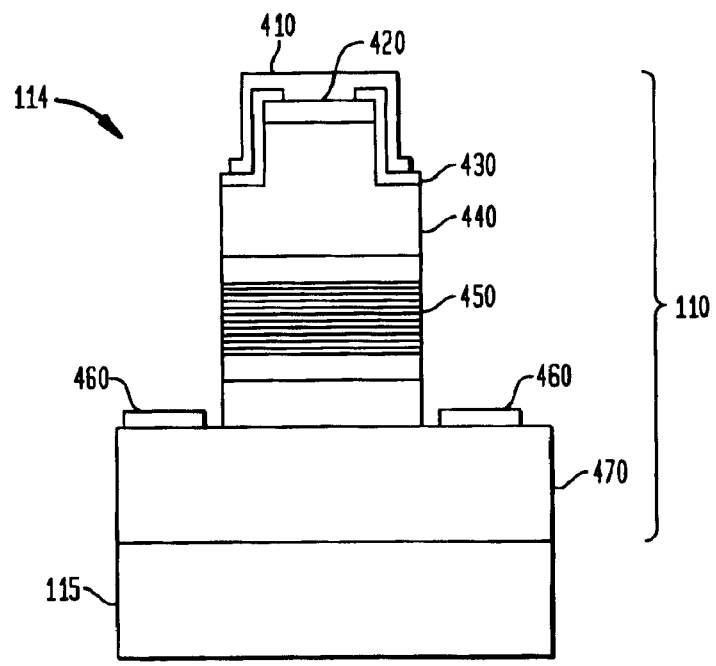
FIG. 4 illustrates a detailed schematic view of an LED according to the invention.

FIG. 4 illustrates a detailed schematic view of an LED according to the invention. The diode 110 of the die 114 generally includes a p-type portion, an active region, and an n-type portion. The p-type portion may include p-metallization 410, a p-GaN (Gallium Nitride) contact layer 420, a p-cladding layer, and a blocking layer. The p-type portion can include GaN, AlGaN, InAlN or InGaAlN, either intentionally p-doped or unintentionally doped (undoped). In one approach, the p-type portion includes an $In_xAl_yGa_{1-x-y}N$ (Indium Aluminum Gallium Nitride) super lattice (SL) 440 ($0 \leq x+y \leq 1$). The active region may include an $In_xAl_yGa_{1-x-y}N$ multi-quantum well (MQW) or heterostructure 450. In some designs the active region may be a homojunction between p- and n-portions of the same semiconducting material. The n-type portion may include n-metallization 460, an n-cladding layer 470 and an n-blocking layer. The p-type portion can include GaN, AlGaN, InAlN or InGaAlN, either intentionally p-doped or unintentionally doped (undoped). In one approach, the n-type portion includes an $In_xAl_yGa_{1-x-y}N$ (Indium Aluminum Gallium Nitride) super lattice (SL) 440 ($0 \leq x+y \leq 1$). Several doping strategies can be used in the n- and p-portions of this structure, such as uniform doping, codoping, or delta-doping. A dielectric layer 430 may also be added for passivation and/or protection. UV LEDs composed of semiconductor materials other than III-nitrides can be similarly designed.

Also, as mentioned, the integral encapsulant/lens or encapsulant and lens combination may be used with a semiconductor diode laser as well as for an LED. A laser can be created by forming a resonant chamber in a diode. For example, in the diode die 110 of FIG. 4, a Bragg layer in the end cladding on the epitaxy can be used instead of the p-metal 410, and a Bragg reflector can be used in the n or p cladding. Note that, instead of flipping the chip and taking light out of the substrate, light can be taken out of the active region. Many other designs are possible, of course, and many LEDs and laser diodes are commercially available.

As discussed, the invention discloses a method for providing a semiconductor diode where amorphous fluoropolymers can be readily injection molded to any desired shape, such as into an encapsulant and lens. In a further aspect, amorphous fluoropolymers can be spun onto LED microarrays for the creation of LED microarrays. A single die or a microarray, e.g., an array of several joined die, may be coated.

In a particular approach, amorphous fluoropolymers such as Teflon AF® may be used to encapsulate a diode such as an LED by at least two methods. In a first method, a dilute solution (typically 5% by weight) of Teflon AF® in a mixture of C5–C18 perfluoro solvents, such as 3M Corporation's FC-75 grade or equivalent, is made up. The solution is applied using a dropper, manual syringe, automated syringe or other dispensing method as a thin coating to the surface of the LED, then allowed to dry. A series of such coatings can be applied to build up a sufficiently thick layer to provide the required optical characteristics and protection for the electronic components. The coatings may be cured at room temperature overnight or at temperatures of 50–70 degrees C. for one hour until the solvent has evaporated.

In a second method, dry Teflon AF can be formed around the LED structure by placing a quantity of the dry material over the LED or within the cup, if such is present, then placing this assembly in a convection oven at temperature between 350 and 400 C for 15 min or until the thermoplastic has melted and flowed around the LED, thereby encapsulating it. Alternatively, a transfer mold may be constructed to accommodate the volume of material required to encapsulate the LED structure, and the thermoplastic injection molded around the LED at temperature exceeding the melting point of the polymer (340 degrees C.) but not exceeding 400 degrees C. Details of the injection molding procedure for this resin are specified in the manufacturer's (DuPont) literature.

In a test performed by the inventors, a 345 nm UV LED was encapsulated with Teflon AF®. Results showed full passage of UV light. There was approximately 80% transmission through an approximately 5 mm thick molding of Teflon AF®.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention, which is defined by the appended claims.

What is claimed is:

1. A light-emitting device, comprising:

a semiconductor diode die that emits light through at least one face thereof; and an encapsulant that at least partially encapsulates the semiconductor diode die, the encapsulant including at least a portion adjacent the face that comprises an amorphous fluoropolymer.

2. The light-emitting device of claim 1, wherein:

the portion of the encapsulant adjacent the face is shaped to form at least a portion of a lens for directing the light emitted through the face.

3. The light-emitting device of claim 1, wherein:

the portion of the encapsulant adjacent the face comprises a lens for directing the light emitted through the face.

4. The light-emitting device of claim 1, wherein:

the semiconductor diode die comprises a flip chip grown on a substrate that forms the face.

5. The light-emitting device of claim 4, wherein:

the substrate comprises sapphire.

6. The light-emitting device of claim 1, wherein:

the encapsulant is injection molded.

7. The light-emitting device of claim 1, further comprising:

a lens comprising an amorphous fluoropolymer, joined to the encapsulant, for directing the light emitted through the face.

8. The light-emitting device of claim 1, wherein:

the semiconductor diode die comprises a light-emitting diode die.

9. The light-emitting device of claim 1, wherein:

the semiconductor diode die comprises a laser diode die.

10. The light-emitting device of claim 1, wherein:

the emitted light comprises ultraviolet light.

11. The light-emitting device of claim 1, wherein:

the emitted light comprises infrared light.

12. The light-emitting device of claim 1, wherein:

the portion adjacent the face substantially consists of amorphous fluoropolymer.

13. The light-emitting device of claim 1, wherein:

the encapsulant substantially consists of amorphous fluoropolymer.

14. A light-emitting device, comprising:

a semiconductor diode die that emits light through at least one face thereof; and an integral encapsulant and lens comprising an amorphous fluoropolymer that encapsulates at least the face and directs the light emitted through the face.

15. A light-emitting device, comprising:

a semiconductor diode die that emits light through at least one face thereof;

an encapsulant comprising an amorphous fluoropolymer that encapsulates at least the face; and at least one lens comprising an amorphous fluoropolymer joined to the encapsulant for directing the light emitted through the face.

* * * * *